United States Patent
Seo et al.

(10) Patent No.: US 8,168,967 B2
(45) Date of Patent: May 1, 2012

(54) ORGANIC LIGHT EMITTING DEVICE AND METHOD OF MANUFACTURING THE SAME

(75) Inventors: Sang Joon Seo, Yongin (KR); Kie Hyun Nam, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 191 days.

(21) Appl. No.: 12/763,426

(22) Filed: Apr. 20, 2010

(65) Prior Publication Data

US 2010/0295031 A1 Nov. 25, 2010

(30) Foreign Application Priority Data

May 21, 2009 (KR) .................. 10-2009-0044497

(51) Int. Cl.
- H01L 35/24 (2006.01)
- H01L 51/00 (2006.01)
- H01L 21/00 (2006.01)
- H01L 33/00 (2010.01)

(52) U.S. Cl. .................... 257/40; 257/13; 257/E51.018; 438/22; 438/99

(58) Field of Classification Search .................. 257/13, 257/40, 79, 100, E51.018; 438/30, 40, 99
See application file for complete search history.

(56) References Cited

U.S. PATENT DOCUMENTS

| 7,183,197 | B2 * | 2/2007 | Won et al. ............... 438/622 |
| 2004/0065544 | A1 * | 4/2004 | Igarashi et al. ............ 204/296 |
| 2005/0037240 | A1 * | 2/2005 | Haoto et al. .............. 428/698 |

FOREIGN PATENT DOCUMENTS

KR 10-2004-0088375 A 10/2004

OTHER PUBLICATIONS

Protection of organic light-emitting diodes over 50000 hours by Cat-CVD SiNx/SiOxNy stacked thin films, Ogawa, et al. Elsevier B.V., Aug. 8, 2007, Thin Solid Films 516, p. 611-614 (Cited in the Korean Office Action issued by Jan. 3, 2011, corresponding to Korean Patent Application No. 10-2009-0044497 with English abstract attached.).

Korean Office Action issued by Jan. 3, 2011, corresponding to Korean Patent Application No. 10-2009-0044497 and Request for Entry of the Accompanying Office Action attached herewith.

* cited by examiner

*Primary Examiner* — Thomas L Dickey
*Assistant Examiner* — Nikolay Yushin
(74) *Attorney, Agent, or Firm* — Robert E. Bushnell, Esq.

(57) ABSTRACT

An organic light emitting device and a method of manufacturing the same, the device including: a substrate; a barrier layer; a first electrode; a second electrode; and an organic layer interposed between the first electrode and the second electrode, wherein the barrier layer includes an SiO layer and an $SiO_xN_y$ layer.

15 Claims, 3 Drawing Sheets

ORGANIC LIGHT EMITTING DEVICE AND METHOD OF MANUFACTURING THE SAME

CROSS-REFERENCE TO RELATED APPLICATION

This application claims the benefit of Korean Patent Application No. 10-2009-0044497, filed May 21, 2009, in the Korean Intellectual Property Office, the disclosure of which is incorporated herein by reference.

BACKGROUND

1. Field

The present teachings relate to an organic light emitting device and a method of manufacturing the organic light emitting device.

2. Description of the Related Art

Highly flexible substrates are used for thin film encapsulation and flexile display devices, due to the characteristics thereof. Organic light emitting display (OLED) devices include organic materials, which are degraded by exposure to oxygen or humidity. Research into polycarbonate, polyimide, or poly (arylene ether sulfone), as a material for forming a plastic substrate, has been actively performed. In general, the water vapor transmission rate (WVTR) of a plastic substrate is in the range of 10 to 1,000 g/m²/day. However, in order to manufacture an OLED having a long lifetime, the WVTR should be $1 \times 10^{-6}$ g/m²/day, or less. To satisfy this need, in general, a humidity blocking layer is formed on a substrate.

Currently, electronic devices are encapsulated using an adhesive agent, to prevent the permeation of humidity. In this case, however, a small amount of humidity can still permeate into electronic devices, through the adhesive agent and a substrate thereof. Thus, water absorbing agents are used to actively remove humidity from electronic devices. However, since water absorbing agents are not transparent, there have been several attempts to replace water absorbing agents with a stack of ten or more transparent thin films. However, a stack of multiple films causes a decrease in transparency, tact time, and film stress.

SUMMARY

The present teachings provide an organic light emitting device including a substrate; a barrier layer; a first electrode; a second electrode; and an organic layer interposed between the first electrode and the second electrode. The barrier layer includes an SiO inorganic layer and an SiON inorganic layer.

The present teachings also provide a method of manufacturing the organic light emitting device.

According to an aspect of the present teachings, there is provided a barrier layer that includes a double-layered structure of an SiO inorganic layer and an $SiO_xN_y$ inorganic layer, where x is in the range of 0.1 to 1, and y is in the range of 0.1 to 1.

According to an aspect of the present teachings, the density of the $SiO_xN_y$ inorganic layer may be greater than the density of the SiO inorganic layer.

According to an aspect of the present teachings, the thickness of the SiO inorganic layer may be in the range of 450 to 600 nm.

According to an aspect of the present teachings, the thickness of the $SiO_xN_y$ inorganic layer may be in the range of 0.5 to 5 nm.

According to an aspect of the present teachings, the thickness of the barrier layer may be in the range of 1 nm to 1000 nm.

According to an aspect of the present teachings, the thickness of the barrier layer may be in the range of 300 nm to 500 nm.

According to an aspect of the present teachings, the barrier layer may have an SiO inorganic layer/$SiO_xN_y$ inorganic layer/SiO inorganic layer/$SiO_xN_y$ inorganic layer structure.

According to an aspect of the present teachings, there is provided another method of manufacturing an organic light emitting device, the method including: forming an organic light emission unit on a substrate; forming an SiO inorganic layer on the substrate; and forming an $SiO_xN_y$ inorganic layer on the SiO layer, to form a barrier layer covering the organic light emission unit, where x is in a range of 0.1 to 1, and y is in a range of 0.1 to 1. The organic light emission unit includes a first electrode, an organic layer, and a second electrode, which are sequentially formed in the order stated According to an aspect of the present teachings, the SiO inorganic layer is formed by thermal deposition.

According to an aspect of the present teachings, the $SiO_xN_y$ inorganic layer is formed using an $N_2$ plasma treatment.

According to an aspect of the present teachings, after the forming of the $SiO_xN_y$ inorganic layer, the method may further include forming another SiO inorganic layer, by the thermal deposition of SiO on the $SiO_xN_y$ inorganic layer, and forming still another $SiO_xN_y$ inorganic layer on the SiO inorganic layer, thereby forming an SiO inorganic layer/$SiO_xN_y$ inorganic layer/SiO inorganic layer/$SiO_xN_y$ inorganic layer structure.

Additional aspects and/or advantages of the present teachings will be set forth in part in the description which follows and, in part, will be obvious from the description, or may be learned by practice of the present teachings.

BRIEF DESCRIPTION OF THE DRAWINGS

These and/or other aspects and advantages of the teachings will become more apparent and more readily appreciated from the following description of the exemplary embodiments, taken in conjunction with the accompanying drawings of which.

DETAILED DESCRIPTION OF THE EXEMPLARY EMBODIMENTS

Reference will now be made in detail to the exemplary embodiments of the present teachings, examples of which are illustrated in the accompanying drawings, wherein like reference numerals refer to the like elements throughout. The exemplary embodiments are described below, in order to explain the aspects of the present teachings, by referring to the figures.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween.

Figure 1:
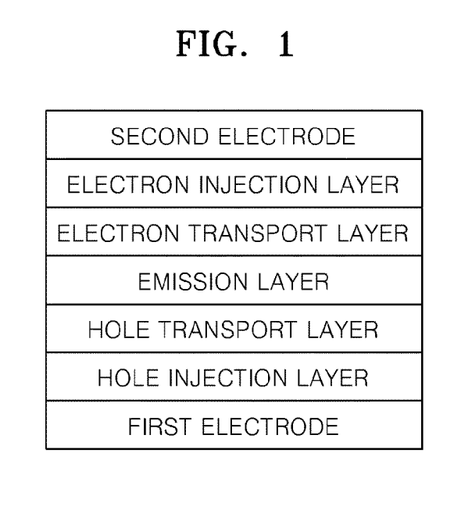
FIG. 1 is a diagram illustrating the structure of an organic light emission unit, according to an exemplary embodiment of the present teachings.

FIG. 1 is a diagram illustrating the structure of an organic light emission unit, according to an exemplary embodiment of the present teachings. The organic light emission unit of FIG. 1 includes a substrate, a first electrode (anode), a hole injection layer, a hole transport layer, an emission layer, an electron transport layer, an electron injection layer, and a second electrode (cathode).

Figure 2:
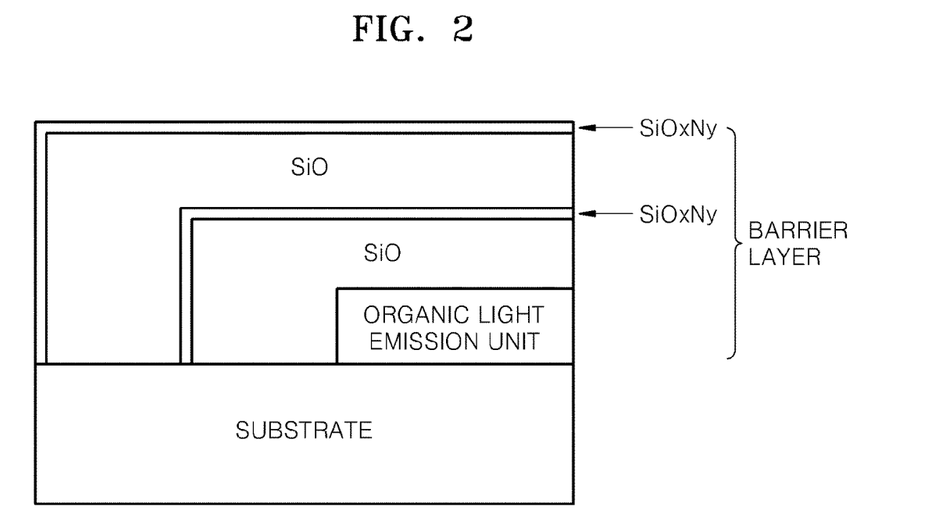
FIG. 2 is an enlarged cross-sectional view of a portion of an organic light emitting device, according to an exemplary embodiment of the present teachings.

FIG. 2 is an enlarged cross-sectional view of a portion of an organic light emitting device, according to an exemplary embodiment of the present teachings. Referring to FIG. 2, the device includes a substrate, an organic light emission unit, and a barrier layer. The barrier layer includes a first SiO inorganic layer, a first $SiO_xN_y$ inorganic layer, a second SiO inorganic layer, and a second $SiO_xN_y$ inorganic layer, where x is in the range of 0.1 to 1, and y is in the range of 0.1 to 1.

Since a conventional inorganic layer that is used as a blocking layer (barrier layer) is formed using an $O_2$ plasma method, or by heating, an organic light emission unit (organic electroluminescent (EL) device) deteriorates, and the reliability thereof is decreased. A generally used sputtering method or chemical vapor deposition (CVD) is suitable for forming an inorganic layer at a low temperature, but the deterioration of an organic EL device, which is induced by $O_2$, has not been addressed.

In addition, when a conventional inorganic layer is formed at a low temperature, the thickness of the inorganic layer is increased, in order to prevent the permeation of humidity, and the increased thickness results in cracks in the inorganic layer. Thus, a blocking layer for thin film encapsulation may have a multi-layer structure including an organic layer, for example, a multi-layer structure including an inorganic layer and an organic layer, or a double-layered structure including a first inorganic layer and a second inorganic layer, wherein the second inorganic layer is less dense than the first inorganic layer.

When a blocking layer for thin film encapsulation has a multi-layer structure including an inorganic layer and an organic layer, the permeation of humidity and oxygen through a main surface of the organic layer is effectively prevented, but the permeation of humidity and oxygen through an edge of the organic layer is difficult to prevent. In addition, a process time for such a multi-layer structure is long. When a blocking layer for thin film encapsulation has a double-layered structure, including a first inorganic layer and a second inorganic layer, wherein the second inorganic layer is less dense than the first inorganic layer, plasma enhanced chemical vapor deposition (PECVD) is often used to form the blocking layer. Even if such a blocking layer is formed using various layer deposition speeds and various materials, the characteristics of the denser first inorganic layer are not controlled at a thicknesses of 30 nm or less. In addition, since defects and particles exist in a layer itself, the less dense second inorganic layer, which is formed later, is formed to have a greater thickness, so as to cover the defects and particles. Furthermore, delamination may occur between the first inorganic layer and the second inorganic layer, and cracks may be formed in the blocking layer.

Since thermal evaporation and $N_2$ plasma treatments are performed at room temperature and do not produce plasma damage, a decrease in device reliability, induced by the deterioration of an organic EL layer, is not considered to occur.

An SiO material has an excellent humidity blocking capability, and when treated with $N_2$ plasma, defects in and the surface roughness of the SiO layer are reduced. In addition, as compared to $SiO_2$, SiO has a higher binding force to N and thus, even when treated with $N_2$ plasma for a short time period, a thin and dense inorganic layer formed of SiON (first inorganic layer) may be formed on the SiO layer (second inorganic layer).

As described above, when a blocking layer is formed by thermal deposition and $N_2$ plasma treatment, fewer defects occur, as compared to when other methods are used, even when the blocking layer is thin. In addition, a high blocking capability can be obtained. When formed in a stack structure, an interlayer is formed between other layers, and since a low temperature process may be used, such a blocking layer can be used for thin film encapsulation.

According to a conventional technique, $SiH_4$ is reacted with $O_2$ to form an $SiO_2$ layer, and an SiON layer is formed by reacting $SiH_4$ with ammonia ($NH_3$). A barrier layer, according to an exemplary embodiment of the present teachings, has a double-layer structure including an $SiO_xN_y$ inorganic layer and an SiO inorganic layer, where x is in a range of 0.1 to 1 and y is in a range of 0.1 to 1, instead of a conventional double-layer structure including an SiON inorganic layer and an $SiO_2$ inorganic layer. Methods of forming the $SiO_xN_y$ inorganic layer and the SiO inorganic layer will be described in detail, below.

According to an exemplary embodiment of the present teachings, the $SiO_xN_y$ inorganic layer may have higher density than the SiO inorganic layer. The thickness of the SiO inorganic layer may be in a range of 450 to 600 nm, and the thickness of the $SiO_xN_y$ inorganic layer may be in a range of 0.5 to 5 nm. When these thicknesses are within these ranges, the performance of the barrier layer is improved. The thickness of the barrier layer may be in a range of 1 nm to 1000 nm, or for example, in a range of 300 nm to 500 nm.

To further improve the performance of the barrier layer, according to an exemplary embodiment of the present teachings, the barrier layer may include a first SiO inorganic layer, a first $SiO_xN_y$ inorganic layer, a second SiO inorganic layer, and a second $SiO_xN_y$ inorganic layer, which are sequentially formed on one another, in the order stated. In this case, an organic light emitting device, according to an exemplary embodiment of the present teachings, may include a substrate; the barrier layer; a first electrode; a second electrode; and an organic layer interposed between the first electrode and the second electrode. In particular, the barrier layer has an SiO inorganic layer/$SiO_xN_y$ inorganic layer/SiO inorganic layer/$SiO_xN_y$ inorganic layer structure, where x is in a range of 0.1 to 1, and y is in a range of 0.1 to 1.

A method of manufacturing an organic light emitting device, according to an exemplary embodiment of the present teachings, includes: forming an organic light emission unit on a substrate; forming a barrier layer on the substrate, by forming an SiO inorganic layer on the substrate; and forming an $SiO_xN_y$ inorganic layer on the SiO inorganic layer, where x is in a range of 0.1 to 1, and y is in a range of 0.1 to 1. The SiO inorganic layer may be formed by thermal deposition. The organic light emission unit comprises a first electrode, a second electrode, and an organic layer disposed therebetween.

In general, SiO is a brown/black non-crystallized, glassy solid. SiO may be obtained by, for example, heating $SiO_2$ and Si to form gaseous SiO. Then, the gaseous SiO is solidified by cooling. According to another example, $SiO_2$ and $H_2$ or CO can be heated at a temperature of about 1500 to 2000° C., to form a gaseous SiO. Then, the gaseous SiO is solidified SiO by cooling. The above methods are exemplified by the following reaction schemes.

$$SiO_2 + Si \rightarrow 2SiO$$

$$SiO_2 + H_2 \rightarrow SiO + H_2O$$

Then, the obtained SiO is decomposed by applying an electric current thereto, at a temperature of from about 1500 to 2000° C., thereby generating a matrix on a substrate, including $SiO_2$ and Si, as shown in the following reaction scheme.

$$2SiO \rightarrow SiO_2 + Si$$

According to an exemplary embodiment of the present teachings, the $SiO_xN_y$ inorganic layer may be formed by treatment with $N_2$ plasma.

After the SiO inorganic layer is formed as described above, an $N_2$ plasma treatment is performed, to form an $SiO_xN_y$ (density: 2.2 to 3.0 g/cm³) inorganic layer on the SiO (density: 2.13 g/cm³) inorganic layer. The $SiO_xN_y$ inorganic layer has lower density than a conventional $Si_3N_4$ (density: 3.4 g/cm³) inorganic layer, but has a higher density than an $SiO_2$ inorganic layer or an SiO inorganic layer. In addition, as compared to $SiO_2$, SiO has an unstable structure and thus, when treated with $N_2$ plasma, the $SiO_xN_y$ may be more easily formed.

According to an exemplary embodiment of the present teachings, SiO is thermally deposited on the $SiO_xN_y$ inorganic layer, to form the second SiO inorganic layer, and then $SiO_xN_y$ is deposited thereon, to form the second $SiO_xN_y$ inorganic layer, thereby sequentially forming two SiO inorganic layers and two $SiO_xN_y$ inorganic layers, as shown in FIG. 2.

An organic light emitting device, according to aspects of the present teachings, may have various structures. The organic light emitting device may include an organic light emission unit that includes a first electrode, a second electrode, and an organic layer interposed therebetween. The organic layer may include at least one layer selected from the group consisting of a hole injection layer, a hole transport layer, an emission layer, a hole blocking layer, an electron transport layer, and an electron injection layer.

The organic light emission unit of the present teachings may have, for example, a first electrode/hole injection layer/hole transport layer/emission layer/electron transport layer/electron injection layer/second electrode structure, or a first electrode/hole injection layer/hole transport layer/emission layer/hole blocking layer/electron transport layer/electron injection layer/second electrode structure.

Referring again to FIGS. 1 and 2, according to aspects of the present teachings, the organic light emitting device can be manufactured as follows. First, the first electrode may be formed by depositing or sputtering a first electrode forming material having a high work function, on a substrate. The first electrode may be an anode or a cathode. The substrate may be any substrate that is used in a conventional organic electroluminescent device. For example, the substrate may be a glass, or a transparent plastic, that has good mechanical strength, thermal stability, and a flat surface, is convenient to handle and/or transparent, and is waterproof. The first electrode forming material may be a conductive material, such as indium tin oxide (ITO), indium zinc oxide (IZO), tin oxide ($SnO_2$), zinc oxide (ZnO), Al, Ag, or Mg. The first electrode may be a transparent electrode or a reflective electrode.

The hole injection layer (HIL) may be formed on the first electrode, using a vacuum-deposition method, a spin-coating method, a casting method, or a Langmuir-Blodgett (LB) deposition method. If the HIL is formed using the vacuum-deposition method, deposition conditions may differ according to an HIL forming material, and the layer structure and thermal characteristics of the target HIL. In this regard, the deposition temperature may generally be in the range of about 100 to 500° C., a vacuum degree may be in the range of $10^{-8}$ to $10^{-3}$ torr, and the deposition rate may be in the range of 0.01 to 100 Å/sec.

If the HIL is formed using the spin-coating method, coating conditions may differ according to an HIL forming material, and the layer structure and thermal characteristics of the target HIL. In this regard, the coating rate may generally be in the range of about 2000 rpm to 5000 rpm, and the heat treatment temperature at which a solvent is removed after the coating may be in the range of about 80° C. to 200° C.

The HIL forming material may be any suitable hole injecting material, for example, phthalocyanine compounds such as copper phthalocyanine, 4,4',4"-tris (3-methylphenylphenylamino)triphenylamine [m-MTDATA], N,N'-di(1-naphthyl)-N,N'-diphenylbenzidine (NPB), TDATA, 2-TNATA, polyaniline/dodecylbenzenesulfonic acid. (Pani/DBSA), poly(3,4-ethylenedioxythiophene)/poly(4-styrenesulfonate) (PEDOT/PSS), polyaniline/camphor sulfonicacid (Pani/CSA), or (polyaniline)/poly (4-styrenesulfonate) (PANI/PSS). However, the HIL forming material is not limited to these materials.

m-MTDATA nyl]-4,4'-diamine(TPD), N,N'-di(naphthalene-1-yl)-N,N'-diphenyl benzidine(α-NPD). Among from these materials, for example, the TPD may transport holes and also prevent excitons from being diffused from the emission layer.

TDATA

2-TNATA

α-NPD

TPD

NPB

The thickness of the HTL may be in the range of about 50 Å to 1000 Å, and in particular, about 100 Å to 600 Å. If the thickness of the HTL is within these ranges, excellent hole transporting characteristics can be obtained, without a substantial increase in driving voltage.

The thickness of the HIL may be in the range of about 100 Å to 10000 Å, or about 100 Å to 1000 Å. If the thickness of the HIL is within these ranges, excellent hole injection characteristics can be obtained, without an increase in driving voltage.

The hole transport layer (HTL) may be formed on the HIL using various methods, such as a vacuum-deposition method, a spin-coating method, a casting method, or a LB deposition method. When the HTL is formed using the vacuum-deposition method or the spin-coating method, deposition conditions and coating conditions may differ, according to an HTL forming material. In this regard, deposition conditions and coating conditions may be the same as, or similar to, those described with reference to the HIL.

The HTL forming material may be any suitable HTL forming material, for example, a carbazole derivative, such as N-phenylcarbazole, or polyvinylcarbazole, or an amine derivative having an aromatic condensation ring, such as NPB, N,N'-bis(3-methylphenyl)-N,N'-diphenyl-[1,1-biphe- The emission layer (EML) may be formed on the HTL using any suitable method, such as a vacuum-deposition method, a spin-coating method, a casting method, or a LB deposition method. When the EML is formed using the vacuum-deposition method or the spin-coating method, deposition conditions and coating conditions may differ, according to an EML forming material. In this regard, deposition conditions and coating conditions may be the same as, or similar to, those described with reference to the HIL.

The EML may be formed using various suitable emission materials, for example, a host and a dopant. The dopant may be any suitable fluorescent dopant, or any suitable phosphorescent dopant. The host may be, for example, Alq3, CBP(4,4'-N,N'-dicarbazole-biphenyl), 9,10-di(naphthalene-2-yl)anthracene (ADN), or DSA (distyrylarylene), but is not limited thereto. A suitable red dopant may be PtOEP, Ir(piq)3, Btp2Ir (acac), or DCJTB, but is not limited thereto.

PtOEP

Ir(piq)₃

Btp2Ir(acac)

Ir(ppy)₃

Ir(ppy)₂(acac)    Ir(mpyp)₃

C545T

A suitable green dopant may be Ir(ppy)3 (ppy=phenylpyridine), Ir(ppy)2(acac), Ir(mpyp)3, or C545T, but is not limited thereto.

Meanwhile, a suitable blue dopant may be F2Irpic, (F2 ppy)2Ir(tmd), Ir(dfppz)3, ter-fluorene, 4,4'-bis(4-diphenylaminostaryl) biphenyl (DPAVBi), or 2,5,8,11-tetra-ti-butyl pherylene (TBP), but is not limited thereto.

F2Irpic (F₂ppy)₂Ir(tmd)

-continued

Ir(dfppz)₃

DPAVBi                    TBP

The amount of the dopant may be in the range of 0.1 to 20 parts by weight, and in particular about 0.5 to 12 parts by weight, based on 100 parts by weight of the EML forming material (that is, the total weight of the host and dopant is set to 100 parts by weight). If the amount of the dopant is within these ranges, a concentration extinction phenomenon may be substantially prevented.

The thickness of the EML may be in the range of about 100 Å to 1000 Å, and in particular, about 200 Å to 600 Å. If the thickness of the EML is within these ranges, excellent emission characteristics can be obtained, without a substantial increase in driving voltage.

If the EML includes a phosphorescent dopant, a hole blocking layer (HBL) (not shown in FIG. 1) may be formed on the EML, in order to prevent the diffusion of triplet exitons or holes into the ETL. In this case, an available HBL forming material may be selected from any suitable HBL forming material. Examples of the HBL forming material include an oxadiazole derivative, a triazole derivative, a phenanthroline derivative, Balq, and BCP.

The thickness of the HBL may be in the range of about 50 Å to 1000 Å, and in particular, about 100 Å to 300 Å. If the thickness of the HBL is less than about 50 Å, hole blocking characteristics may be degraded. On the other hand, if the thickness of the HBL is greater than about 1000 Å, driving voltages may be increased.

Then the electron transport layer (ETL) may be formed on the EML, using any suitable method, such as a vacuum-deposition method, a spin-coating method, or a casting method. When the ETL is formed using the vacuum-deposition method or the spin-coating method, deposition conditions and coating conditions may differ according to an ETL forming material. In this regard, deposition conditions and coating conditions may be the same as, or similar to, those described with reference to the HIL.

The ETL forming material is not particularly limited and may be selected from any suitable ETL forming material. Examples of the ETL forming material include quinoline derivatives, such as tris(8-quinolinolate)aluminum ($Alq_3$), TAZ, and Balq, but are not limited thereto.

TAZ

BAlq

The thickness of the ETL may be in the range of about 100 Å to 1000 Å, and in particular, about 100 Å to 500 Å. If the thickness of the ETL is within these ranges, excellent electron transporting characteristics can be obtained, without a substantial increase in driving voltage.

In addition, an electron injection layer (EIL) that allows electrons to be easily injected from an anode may be formed on the ETL. The EIL may be formed using any suitable EIL forming material, such as LiF, NaCl, CsF, $Li_2O$, or BaO. The deposition conditions and coating conditions of the EIL may differ according to the EIL forming material. In general, however, the deposition conditions and coating conditions may be the same as, or similar to, those described with reference to the HIL.

The thickness of the EIL may be in the range of about 1 Å to 100 Å, and in particular, about 5 Å to 90 Å. If the thickness of the EIL is within these ranges, excellent electron injection characteristics can be obtained, without a substantial increase in driving voltage.

Then, a second electrode is formed on the EIL using a vacuum-deposition method or a sputtering method. The second electrode may function as a cathode or an anode. The second electrode may be formed of a metal, an alloy, an electro-conductive compound, or any mixture thereof, which has a low work function. Examples of such materials include lithium (Li), magnesium (Mg), aluminum (Al), aluminum-lithium (Al—Li), calcium (Ca), magnesium-indium (Mg—In), and magnesium-silver (Mg—Ag). In order to produce a top emission type display device, the second electrode may be formed of a transparent material, such as ITO, or IZO.

Then, a barrier layer is formed on the cathode and the substrate, thereby completing the manufacture of an organic light emitting device.

Hereinafter, examples of organic light emitting devices, according to the present teachings, will be described in detail, but the present teachings are not limited thereto.

Example 1 m-MTDATA(750Å)/α-NPD(150Å)/DSA(300Å): TBPe(3%)/Alq3(200Å)/LiF(80Å)/Al(3000Å)

To form an anode, a 15 Ω/cm² (1200 Å) ITO glass substrate (produced by Corning Co.) was cut to a size of 50 mm×50 mm×0.7 mm, then sonicated with isopropyl alcohol and pure water, for 5 minutes each, and then washed by exposure to ozone, for 30 minutes. Then m-MTDATA was vacuum deposited on the resultant substrate, to form an HIL having a thickness of 750 Å. Then, α-NPD was vacuum deposited on the HIL, to form a HTL having a thickness of 150 Å. DSA as a host and TBPe as a dopant were vacuum deposited on the HTL, to form an EML having a thickness of 300 Å. In this case, the amount of the dopant was 3%. Then, Alq3 was vacuum deposited on the EML, to form an ETL having a thickness of 200 Å. LiF was then vacuum deposited on the ETL, to form an EIL having a thickness of 80 Å. Al was then vacuum deposited on the EIL, to form a cathode having a thickness of 3000 Å, thereby forming LiF/Al electrode and completing the manufacture of an organic light emitting device.

Then, SiO was deposited on the substrate and the cathode in a thermal evaporator, at a pressure of $10^{-5}$ to $10^{-6}$ Torr, thereby forming an SiO inorganic layer having a thickness of 508 nm. Then, the SiO inorganic layer was exposed to $N_2$ plasma at a pressure of $10^{-5}$ to $10^{-6}$, for 180 seconds, thereby forming an $SiO_xN_y$ inorganic layer having a thickness of about 4 nm. The SiO inorganic layer and the $SiO_xN_y$ inorganic layer together constituted a barrier layer. The entire thickness of the barrier layer was about 500 nm.

Figure 3A:
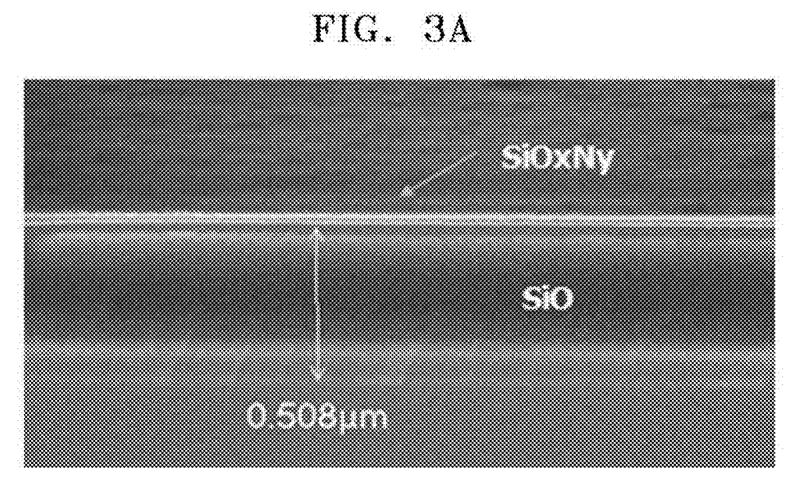
FIG. 3A is an enlarged cross-sectional photographic image (17,000 times magnification) of an organic light emitting device, according to an exemplary embodiment of the present teachings.
Figure 3B:
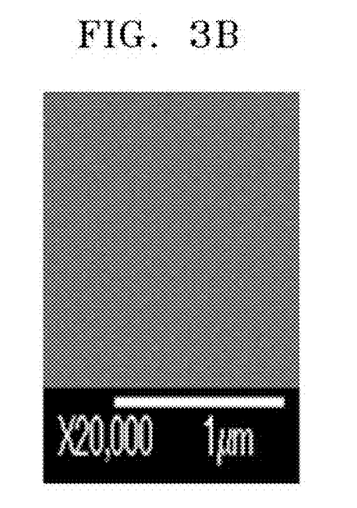
FIG. 3B is an enlarged photographic image (20,000 times magnification) of a surface of an organic light emitting device, according to an exemplary embodiment of the present teachings.

FIG. 3A is an enlarged cross-sectional photographic image (17,000 times magnification) of the organic light emitting device according to Example 1. Referring to FIG. 3A, an SiO layer is formed on a substrate, and a thin $SiO_xN_y$ layer is formed on the SiO layer. FIG. 3B is an enlarged photographic image (20,000 times magnification) of a surface of the organic light emitting device according to Example 1.

Example 2

An organic light emitting device was manufactured in the same manner as in Example 1, except that SiO was deposited on the substrate and the cathode to form an SiO inorganic layer having a thickness of 553.2 nm. An $SiO_xN_y$ inorganic layer having a thickness of about 4 nm was then formed thereon, and then SiO was deposited on the $SiO_xN_y$ inorganic layer, to form another SiO inorganic layer having a thickness of 528.2 nm. Another $SiO_xN_y$ inorganic layer having a thickness of about 4 nm was formed thereon, thereby forming a barrier layer having an SiO inorganic layer/$SiO_xN_y$ inorganic layer/SiO inorganic layer/$SiO_xN_y$ inorganic layer structure. The thickness of the barrier layer was about 1100 nm.

Figure 4A:
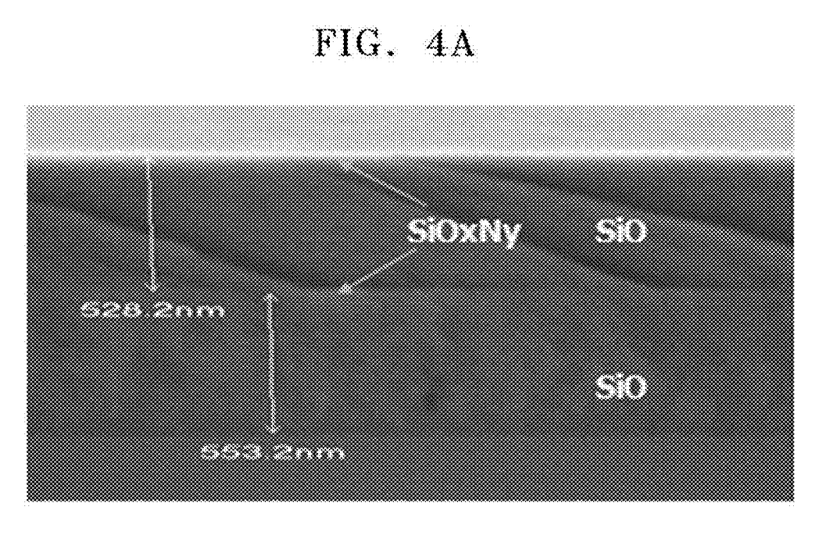
FIG. 4A is an enlarged cross-sectional photographic image (30,000 times) of an organic light emitting device, according to an exemplary embodiment of the present teachings.
Figure 4B:
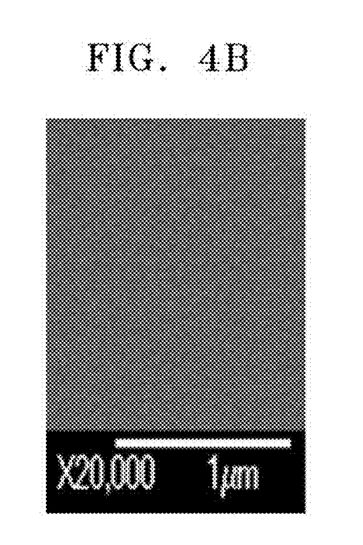
FIG. 4B is an enlarged photographic image (20,000 times) of a surface of an organic light emitting device, according to an exemplary embodiment of the present teachings.

FIG. 4A is an enlarged cross-sectional photographic image (30,000 times) of the organic light emitting device manufactured in Example 2. Referring to FIG. 4A, the structure of the barrier layer is shown. FIG. 4B shows an enlarged image of a surface of the organic light emitting device manufactured in Example 2.

Comparative Example

An organic light emitting device was manufactured in the same manner as in Example 1, except that SiO was deposited on the substrate and the cathode, to form an SiO inorganic layer having a thickness of 500 nm.

Humidity and External Gas Permeation Test

Humidity and external gas permeation tests were performed on the organic light emitting devices manufactured according to Examples 1 and 2 and the Comparative Example. The results are shown in Table 1, below.

TABLE 1

| | Comparative Example | Example 1 | Example 2 |
|---|---|---|---|
| Barrier layer forming material | SiO(thermal deposition) | $SiO_xN_y$($N_2$ plasma) SiO(thermal deposition) | $SiO_xN_y$/SiO(2-layer) |
| Barrier layer structure | SiO/substrate | $SiO_xN_y$/SiO/substrate | $SiO_xN_y$/SiO/$SiO_xN_y$/SiO/substrate |
| Process (substrate) temperature | room temperature | room temperature | room temperature |
| Thickness (entire) | about 500 nm | about 500 nm | about 1100 nm |
| Water vapor transmission Rate (WVTR) (g/m²/day) | 1~0.8 | 0.3~0.07 | <0.01 |

Referring to Table 1, it can be seen that the WVTRs, of the organic light emitting devices manufactured according to Examples 1 and 2 and the Comparative Example, were in the ranges of 0.3 to 0.07 g/m²/day, less than 0.01 g/m²/day, and 1 to 0.8 g/m²/day, respectively. Thus, it can be seen that the WVTRs of Examples 1 and 2 were lower than that of the Comparative Example.

An inorganic complex layer manufactured according to an exemplary embodiment of the present teachings can be formed at room temperature and has excellent water blocking characteristics. Compared to a simple stack structure of single layers, the inorganic complex layer is better suited for forming a layer having a strong interaction force between layers. In addition, since the inorganic complex layer can be formed at room temperature, a material selection range is wider, and various interlayers can be formed, according to various materials and purposes. Furthermore, when a layer having a multi-layer structure is formed, the number of processes can be controlled.

Although a few exemplary embodiments of the present teachings have been shown and described, it would be appreciated by those skilled in the art that changes may be made in these exemplary embodiments, without departing from the principles and spirit of the present teachings, the scope of which is defined in the claims and their equivalents.

What is claimed is:

1. An organic light emitting device comprising:
a substrate;
an organic light emission unit disposed on the substrate, comprising,
   a first electrode;
   a second electrode; and
   an organic layer interposed between the first electrode and the second electrode; and
a barrier layer disposed on the substrate, covering the organic light emission unit, the barrier layer comprising a first SiO layer and a first $SiO_xN_y$ layer disposed on the first SiO layer, wherein x is in a range of about 0.1 to 1, and y is in a range of about 0.1 to 1.

2. The organic light emitting device of claim 1, wherein the density of the first $SiO_xN_y$ layer is greater than the density of the first SiO layer.

3. The organic light emitting device of claim 1, wherein the thickness of the first SiO layer is in a range of about 450 to 600 nm.

4. The organic light emitting device of claim 1, wherein the thickness of the first $SiO_xN_y$ layer is in a range of about 0.5 to 5 nm.

5. The organic light emitting device of claim 1, wherein the thickness of the barrier layer is in a range of about 1 nm to 1000 nm.

6. The organic light emitting device of claim 1, wherein the thickness of the barrier layer is in a range of about 300 nm to 500 nm.

7. The organic light emitting device of claim 1, wherein the barrier layer further comprises:
a second SiO layer disposed on the first $SiO_xN_y$ layer; and
a second $SiO_xN_y$ layer disposed on the second SiO layer.

8. A method of manufacturing an organic light emitting device, the method comprising:
forming an organic light emission unit on a substrate, the organic light emission unit comprising a first electrode, a second electrode, and an organic layer disposed between the first and second electrodes;
forming a first SiO layer on the substrate; and
forming a first $SiO_xN_y$ layer on the first SiO layer, to form a barrier layer, wherein x is in a range of about 0.1 to 1, and y is in a range of about 0.1 to 1.

9. The method of claim 8, wherein the SiO layer is formed by thermal deposition.

10. The method of claim 8, wherein the $SiO_xN_y$ layer is formed using an $N_2$ plasma treatment.

11. The method of claim 8, further comprising:
forming a second SiO layer on the first $SiO_xN_y$ layer; and
forming a second $SiO_xN_y$ layer on the second SiO layer.

12. The method of claim 11, wherein:
the first SiO layer is disposed directly on the organic light emission unit;
the first $SiO_xN_y$ layer is disposed directly on the first SiO layer;
the second SiO layer is disposed directly on the first $SiO_xN_y$ layer; and
the second $SiO_xN_y$ layer is disposed directly on the second SiO layer.

13. The method of claim 8, wherein the barrier layer completely covers the organic light emission unit, and the organic light emission unit is disposed directly on the substrate.

14. An organic light emitting device comprising:
a substrate;
an organic light emission unit disposed on the substrate;
a barrier layer disposed on the substrate, to prevent moisture from contacting the organic light emission unit, the barrier layer comprising,
   a first SiO layer disposed on the organic light emission unit, and
   a first $SiO_xN_y$ layer disposed on the first SiO layer, wherein x is in a range of about 0.1 to 1, and y is in a range of about 0.1 to 1.

15. The organic light emitting device of claim 14, wherein the barrier layer further comprises:
a second SiO layer disposed on the first $SiO_xN_y$ layer; and
a second $SiO_xN_y$ layer disposed on the second SiO layer.

* * * * *